(12) United States Patent
Kim et al.

(10) Patent No.: US 9,825,130 B2
(45) Date of Patent: Nov. 21, 2017

(54) LEAKAGE REDUCTION STRUCTURES FOR NANOWIRE TRANSISTORS

(71) Applicant: Intel Corporation, Santa Clara, CA (US)

(72) Inventors: Seiyon Kim, Portland, OR (US); Kelin Kuhn, Aloha, OR (US); Rafael Rios, Austin, TX (US); Mark Armstrong, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,845

(22) PCT Filed: Mar. 14, 2013

(86) PCT No.: PCT/US2013/031133
§ 371 (c)(1),
(2) Date: Jan. 24, 2014

(87) PCT Pub. No.: WO2014/142856
PCT Pub. Date: Sep. 18, 2014

(65) Prior Publication Data
US 2014/0264253 A1    Sep. 18, 2014

(51) Int. Cl.
*H01L 29/06* (2006.01)
*H01L 21/265* (2006.01)
(Continued)

(52) U.S. Cl.
CPC .......... *H01L 29/0673* (2013.01); *H01L 29/16* (2013.01); *H01L 29/42392* (2013.01);
(Continued)

(58) Field of Classification Search
CPC ....... H01L 29/42392; H01L 21/823821; H01L 29/0673; H01L 29/66439; H01L 29/775;
(Continued)

(56) References Cited

U.S. PATENT DOCUMENTS 7,274,051 B2 * 9/2007 Kim et al. .................. 257/213
7,374,986 B2 * 5/2008 Kim .................. H01L 29/42392
257/210
(Continued)

FOREIGN PATENT DOCUMENTS

CN    1855390 A    11/2006
CN    102315129 A    1/2012
(Continued)

OTHER PUBLICATIONS

International Search Report and Written Opinion received for Patent Application No. PCT/US2013/031133, mailed on Dec. 19, 2013, 11 pages.
(Continued)

*Primary Examiner* — Latanya N Crawford
(74) *Attorney, Agent, or Firm* — Green, Howard & Mughal LLP

(57) ABSTRACT

A nanowire device of the present description may include a highly doped underlayer formed between at least one nanowire transistor and the microelectronic substrate on which the nanowire transistors are formed, wherein the highly doped underlayer may reduce or substantially eliminate leakage and high gate capacitance which can occur at a bottom portion of a gate structure of the nanowire transistors. As the formation of the highly doped underlayer may result in gate inducted drain leakage at an interface between source structures and drain structures of the nanowire transistors, a thin layer of undoped or low doped material may be formed between the highly doped underlayer and the nanowire transistors.

21 Claims, 19 Drawing Sheets

(51) Int. Cl.
*H01L 29/423* (2006.01)
*H01L 29/66* (2006.01)
*H01L 29/775* (2006.01)
*H01L 29/786* (2006.01)
*H01L 29/16* (2006.01)
*H01L 29/78* (2006.01)

(52) U.S. Cl.
CPC ...... *H01L 29/66439* (2013.01); *H01L 29/775* (2013.01); *H01L 29/78696* (2013.01); *H01L 29/785* (2013.01)

(58) Field of Classification Search
CPC .. H01L 29/78696; H01L 29/16; H01L 29/785
See application file for complete search history.

(56) References Cited

U.S. PATENT DOCUMENTS

| | | | |
|---|---|---|---|
| 8,497,171 B1* | 7/2013 | Wu et al. | 438/218 |
| 8,748,940 B1* | 6/2014 | Rachmady | H01L 29/785 257/190 |
| 2008/0020537 A1* | 1/2008 | Kim | H01L 29/42392 438/308 |
| 2008/0099849 A1 | 5/2008 | Kim et al. | |
| 2009/0242990 A1* | 10/2009 | Saitoh et al. | 257/351 |
| 2011/0074498 A1* | 3/2011 | Thompson | H01L 21/82341 327/543 |
| 2011/0079829 A1* | 4/2011 | Lai et al. | 257/288 |
| 2011/0079860 A1 | 4/2011 | Verhulst | |
| 2011/0147711 A1 | 6/2011 | Pillarisetty et al. | |
| 2012/0056275 A1 | 3/2012 | Cai et al. | |
| 2012/0319211 A1* | 12/2012 | Van Dal et al. | 257/401 |
| 2013/0011980 A1 | 1/2013 | Huang et al. | |
| 2013/0105914 A1* | 5/2013 | Lin | H01L 29/7851 257/402 |
| 2013/0234215 A1* | 9/2013 | Okano | 257/255 |
| 2014/0001572 A1* | 1/2014 | Bohr et al. | 257/401 |
| 2014/0008700 A1* | 1/2014 | Rachmady | H01L 29/66431 257/192 |
| 2014/0151761 A1* | 6/2014 | Hsieh | H01L 29/66545 257/288 |
| 2014/0167108 A1* | 6/2014 | Rachmady | H01L 29/785 257/190 |

FOREIGN PATENT DOCUMENTS

| | | |
|---|---|---|
| CN | 102891087 A | 1/2013 |
| JP | H4-186774 A | 7/1992 |
| JP | H8-139325 A | 5/1996 |
| JP | 2005-340810 A | 12/2005 |
| JP | 2006-80519 A | 3/2006 |
| JP | 2009-158853 A | 7/2009 |
| JP | 2009-267021 A | 11/2009 |
| JP | 2012-064695 A | 3/2012 |
| KR | 10-2011-0107207 A | 9/2011 |
| WO | 2014/142856 A1 | 9/2014 |

OTHER PUBLICATIONS

International Preliminary Report on Patentability and Written Opinion Received for PCT Patent Application No. PCT/US2013/031133, mailed on Sep. 24, 2015, 8 pages.

Office Action and Search Report Received for Chinese Patent Application No. 201380073081.1, dated on Jun. 2, 2017, 17 pages Of Chinese Office Action and Search report including 10 page Of English Translation.

Office Action received for Japanese Patent Application No. 2016-500037, dated on Jan. 24, 2017, 2 pages of English Translation and 2 pages of Japanese Office Action.

* cited by examiner

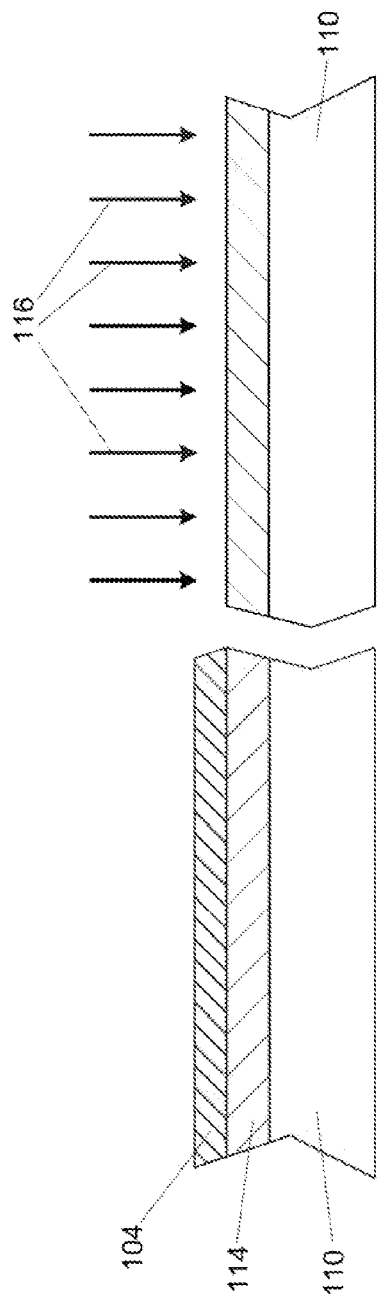
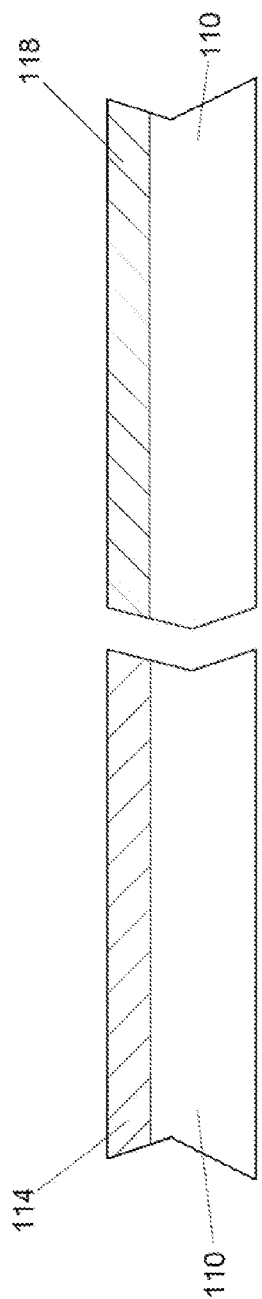

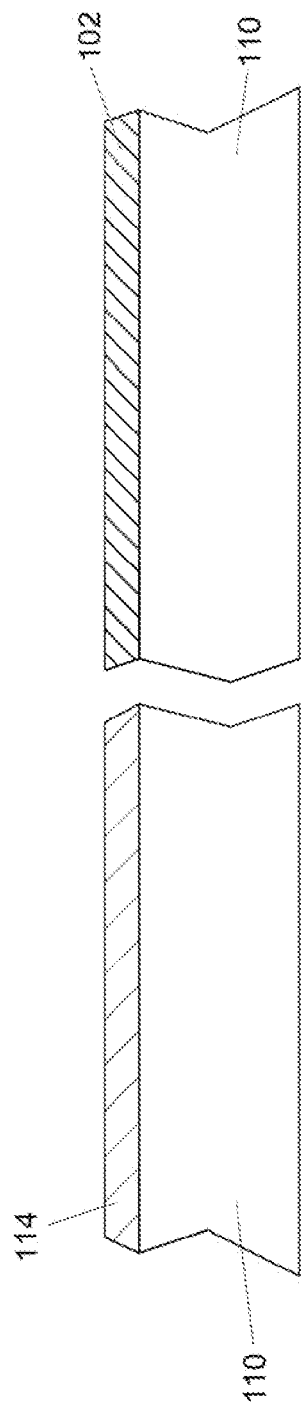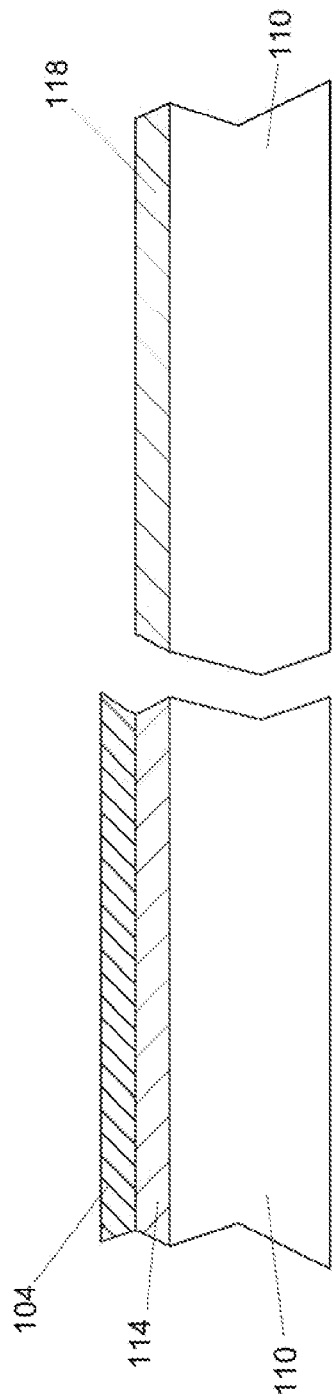

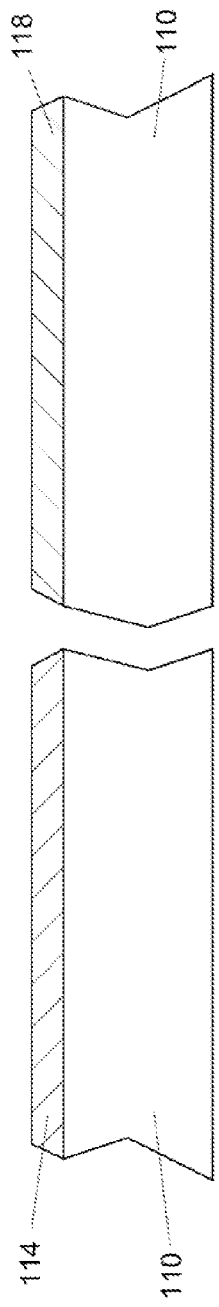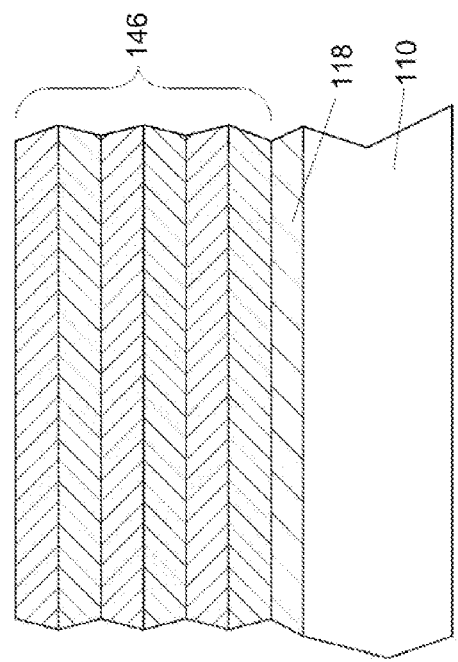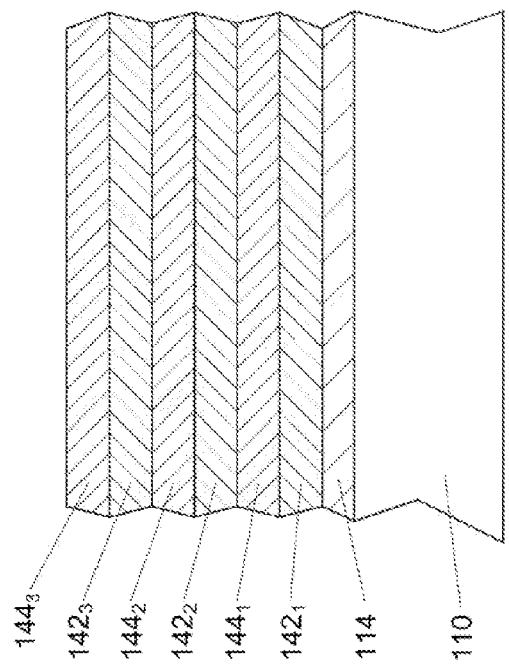

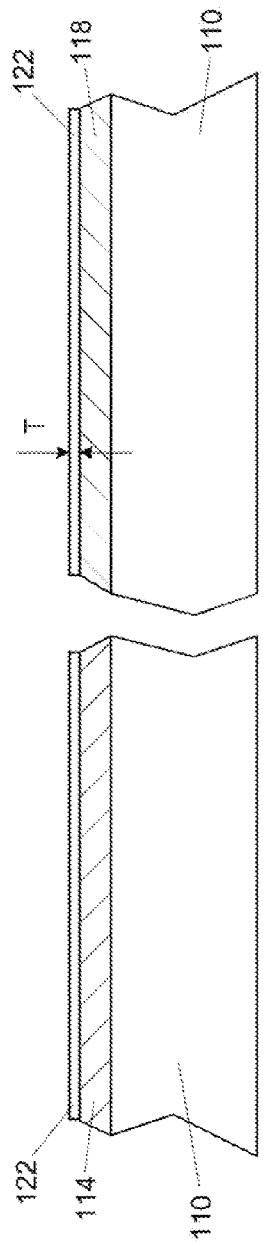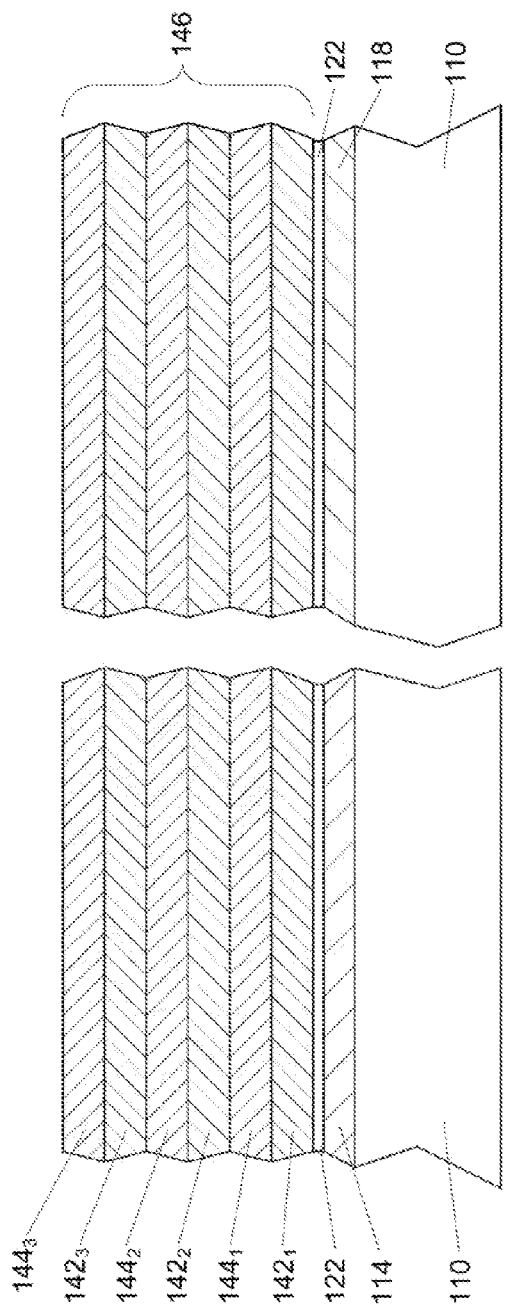

LEAKAGE REDUCTION STRUCTURES FOR NANOWIRE TRANSISTORS

TECHNICAL FIELD

Embodiments of the present description generally relate to the field of nanowire microelectronic devices, and, more particularly, to nanowire structure having underlayers between a microelectronic substrate and nanowire transistors formed thereon to substantially reduce or eliminate leakage for NMOS and PMOS structures.

BACKGROUND

Higher performance, lower cost, increased miniaturization of integrated circuit components, and greater packaging density of integrated circuits are ongoing goals of the microelectronic industry for the fabrication of microelectronic devices. As these goals are achieved, the microelectronic devices scale down, i.e. become smaller, which increases the need for optimal performance from each integrated circuit component.

Maintaining mobility improvement and short channel control as microelectronic device dimensions scale down past the 15 nanometer (nm) node provides a challenge in microelectronic device fabrication. Nanowires may be used to fabricate microelectronic devices which provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example).

Many different techniques have been attempted to fabricate and size nanowire-based device. However, improvements may still be need in the area of transistor leakage and gate capacitance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

FIGS. 3-6 are side cross-sectional views of a process of forming highly-doped underlayers on a microelectronic substrate, according to an embodiment of the present description.

FIGS. 7-9 are side cross-sectional views of a process of forming highly-doped underlayers on a microelectronic substrate, according to another embodiment of the present description.

FIG. 10 is a side cross-sectional view of a stacked layer formed on the highly doped underlayers, according to an embodiment of the present description.

FIG. 11 is a side cross-sectional view of forming a low doped underlayer on the highly doped underlayers, according to an embodiment of the present description.

FIG. 12 is a side cross-sectional view of a stacked layer formed on the low doped underlayer of FIG. 11, according to an embodiment of the present description.

DESCRIPTION OF EMBODIMENTS

Figure 1:
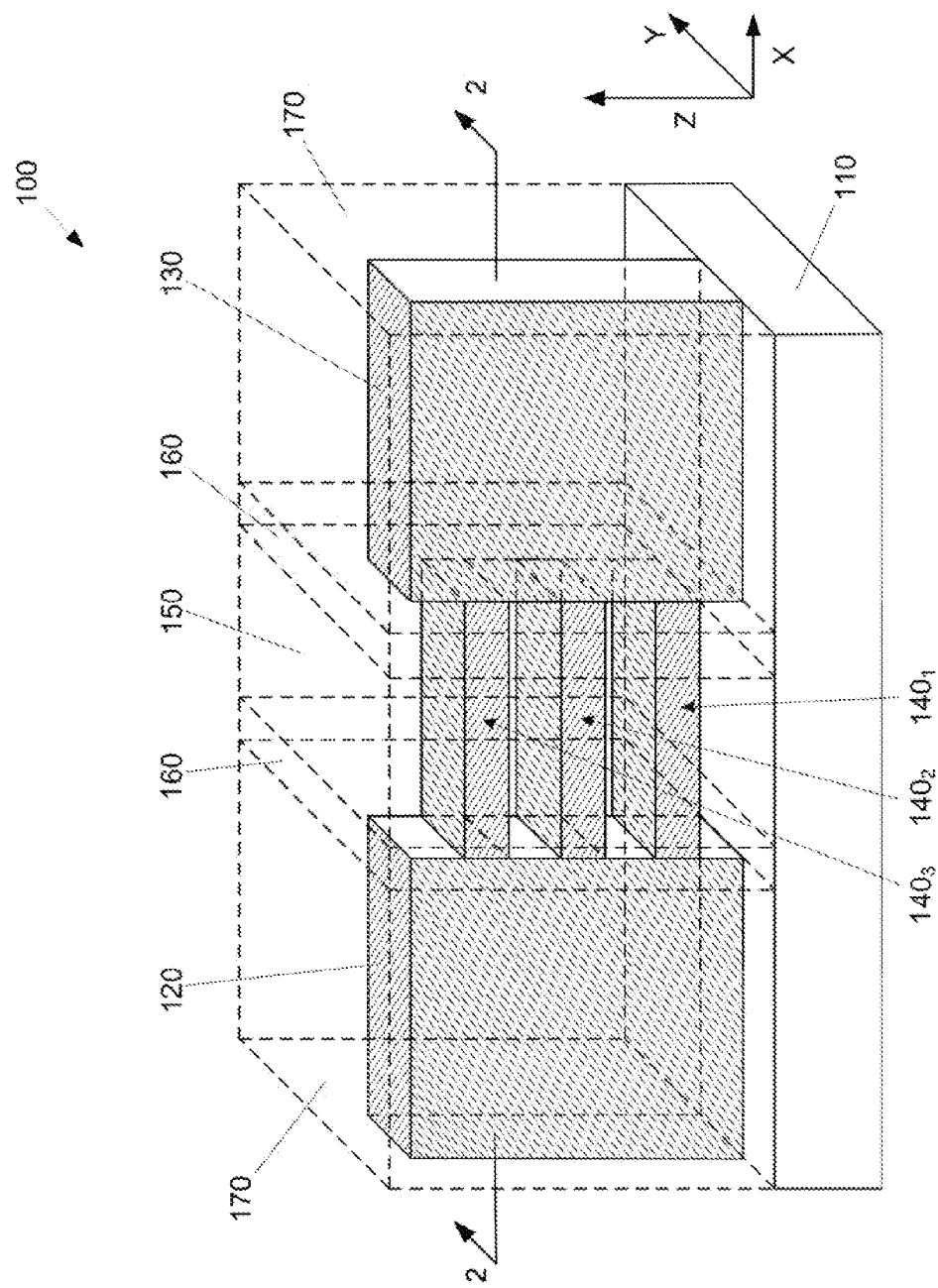
FIG. 1 is an oblique view of a nanowire transistor.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

FIG. 1 illustrates an embodiment of a microelectronic structure, such as a nanowire device structure. As illustrated, a nanowire transistor 100 may be formed on a microelectronic substrate 110. The nanowire transistor 100 may comprise a source structure 120 and a drain structure 130, which is spaced apart from the source structure 120. A plurality undoped channel nanowires (illustrated as elements $140_1$, $140_2$, and $140_3$, and may be referred to herein collectively as "nanowires $140_n$") may extend between the source structure 120 and the drain structure 130, wherein the nanowires $140_n$ may be aligned vertically (e.g. z-direction) and spaced apart from one another. A gate structure 150 may surround the nanowires $140_n$, wherein the gate structure 150 is bounded by spacers 160 on opposing sides thereof. As illustrated, an interlayer dielectric material 170 may substantially surround the source structure 120 and the drain structure 130. The materials utilized and the processes performed to form the nanowire transistor 100 will be subsequently discussed.

Figure 2:
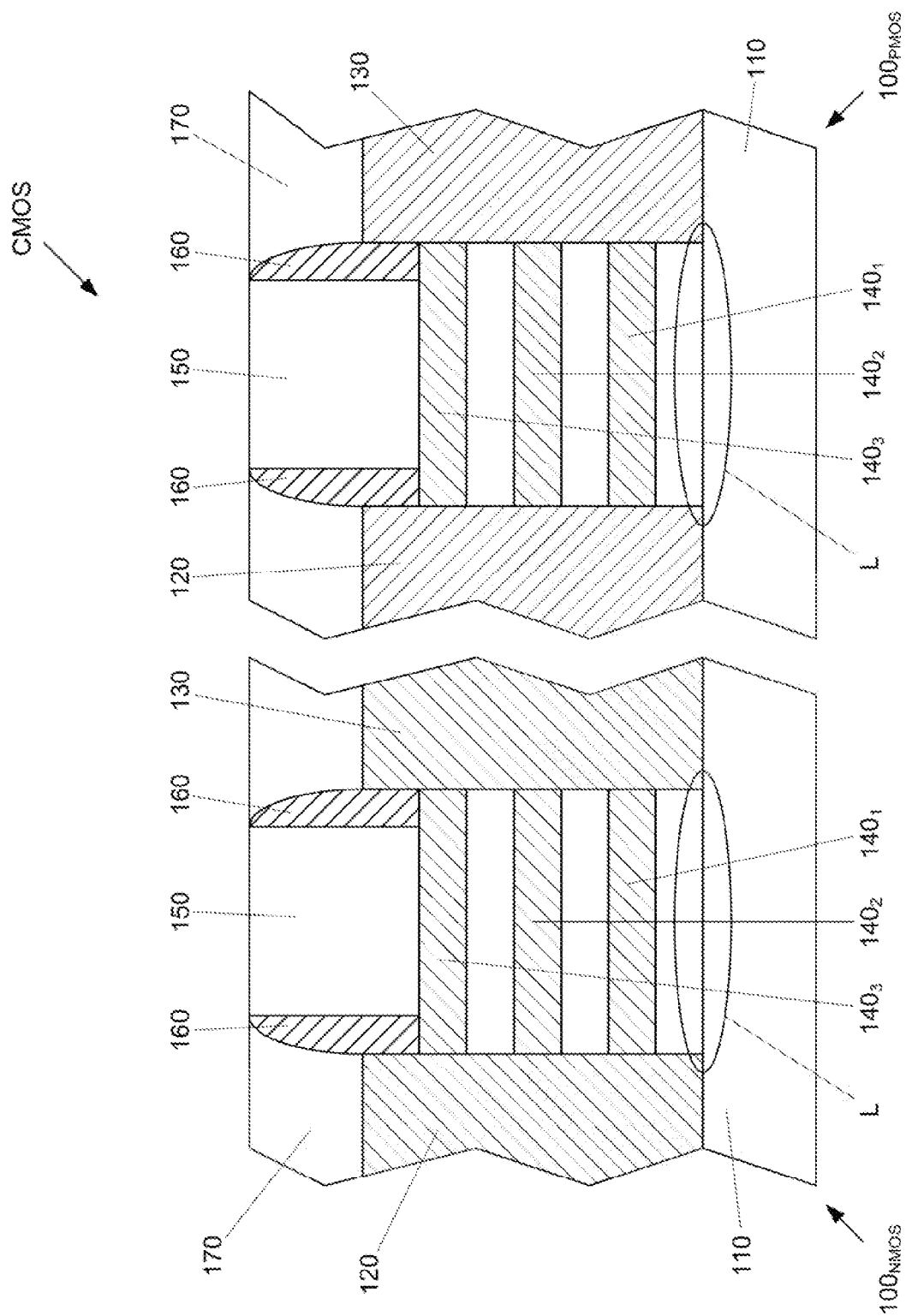
FIG. 2 is a side cross-sectional view of attaching an NMOS nanowire transistor and a PMOS nanowire transistor, generally viewed along line 2-2 of FIG. 1.

As shown in FIG. 2, the nanowire transistor 100 of FIG. 1 may be formed as an N-type Metal Oxide Semiconductor device or NMOS nanowire transistor, labeled as "100$_{NMOS}$", or a P-type Metal Oxide Semiconductor device or PMOS nanowire transistor, labeled as "1000$_{PMOS}$", as will be understood to those skilled in the art. It is understood that the NMOS nanowire transistor 100$_{NMOS}$ and PMOS nanowire transistor 100$_{PMOS}$ may be formed on the same microelectronic substrate 110 and may be connected in a single circuit, which is collectively known as a Complementary Metal Oxide Semiconductor device, labeled as "CMOS". In the operation of either the PMOS nanowire transistors 100$_{PMOS}$ or the NMOS nanowire transistors 100$_{NMOS}$, leakage and high gate capacitance can occur at a bottom of the gate structure 150, i.e. the area of the gate structure 150 abutting the microelectronic substrate 110 illustrated with circle L.

Embodiments of the present description relate to nanowire devices having a highly doped underlayer formed between nanowire transistors and the microelectronic substrate on which the nanowire transistors are formed, wherein the highly doped underlayer may reduce or substantially eliminate leakage and high gate capacitance which can occur at a bottom portion of a gate structure of the nanowire transistors. As the formation of the highly doped underlayer may result in gate induced drain leakage at an interface between source structures and drain structures of the nanowire transistors, a thin layer of undoped or low doped material may be formed between the highly doped underlayer and the nanowire transistors to reduce or substantially eliminate such gate induced drain leakage.

Figure 3:
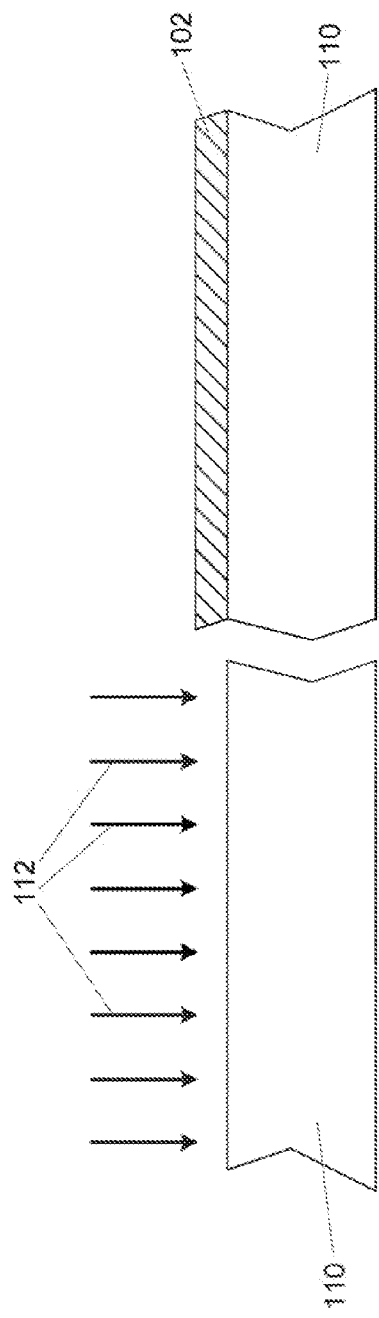

FIGS. 3-6 illustrate an embodiment of fabricating highly doped underlayers according to one embodiment of the present description. As illustrated in FIG. 3, the microelectronic substrate 110 may be provided or formed from any suitable material. In one embodiment, the microelectronic substrate 110 may be a bulk substrate composed of a single crystal of a material which may include, but is not limited to, silicon, germanium, silicon-germanium or a III-V compound semiconductor material. In other embodiments, the microelectronic substrate 110 may comprise a silicon-on-insulator substrate (SOI), wherein an upper insulator layer composed of a material which may include, but is not limited to, silicon dioxide, silicon nitride or silicon oxynitride, disposed on the bulk substrate. Alternatively, the microelectronic substrate 110 may be formed directly from a bulk substrate and local oxidation is used to form electrically insulative portions in place of the above described upper insulator layer.

Figure 4:
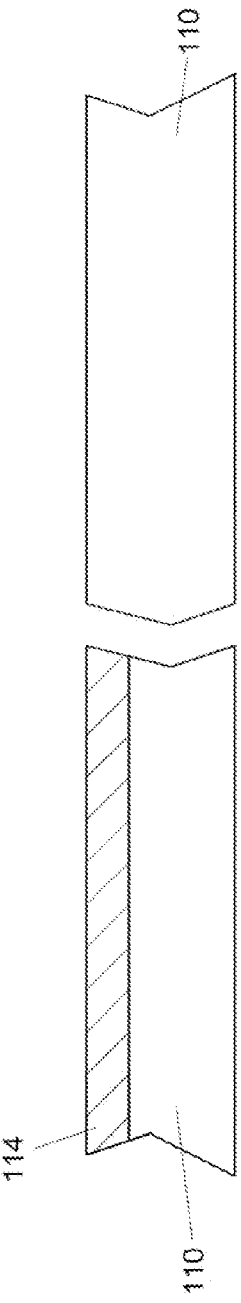

As illustrated further illustrated in FIG. 3, a portion of the microelectronic substrate 110, where at least one PMOS nanowire transistor may be formed (see element 100$_{PMOS}$ of FIG. 2), may be masked with any appropriate first masking material 102, including but not limited to photoresist materials, such as poly methyl methacrylate, poly methyl glutarimide, phenol formaldehyde resin, and the like. The non-masked portion of the microelectronic substrate 110 where NMOS nanowire transistors may be formed (see element 100$_{NMOS}$ of FIG. 2), may be ion implanted with at least one P-type dopant, which may include, but is not limited to, phosphorous, arsenic, and antimony, illustrated by arrows 112 in FIG. 3, to form a highly P-doped underlayer 114, as shown in FIG. 4. As also shown in FIG. 4, the first masking material 102 of FIG. 3 may be removed. As shown in FIG. 5, a portion of the microelectronic substrate 110 where at least one NMOS nanowire transistor (see element 100$_{NMOS}$ of FIG. 2) may be formed may be masked with any appropriate second masking material 104, such as described with regard to the first masking material 102. The non-masked portion of the microelectronic substrate 110 where PMOS nanowire transistors (see element 100$_{PMOS}$ of FIG. 2) may be formed may be ion implanted with at least one N-type dopant, which may include, but is not limited to, boron, aluminum, and gallium, illustrated by arrows 116 in FIG. 5, to form a highly N-doped underlayer 118, as shown in FIG. 6. As also shown in FIG. 6, the second masking material 104 of FIG. 5 may be removed. The removal of the first masking material 102 and the second masking material 104 may be achieved with any known technique, including but not limited to chemical stripping and ashing (plasma in fluorine or oxygen).

In another embodiment of the present description, as illustrated in FIG. 7, a portion of the microelectronic substrate 110, where at least one PMOS nanowire transistor will be formed (see element 100$_{PMOS}$ of FIG. 2) may be masked with any appropriate first masking material 102. The non-masked portion of the microelectronic substrate 110, where NMOS transistors will be formed (see element 100$_{NMOS}$ of FIG. 2), may have a highly P-doped underlayer 114 formed thereon. The highly P-doped underlayer 114 may be epitaxially deposited, such as by chemical vapor deposition, on the microelectronic substrate 110, as also shown in FIG. 7. The highly P-doped underlayer 114 may be a monocrystalline film, such as silicon, wherein the microelectronic substrate 110 acts as a seed crystal and the highly P-doped underlayer 114 takes on the lattice structure and orientation of the microelectronic substrate 110. It will be understood to those skilled in the art, any combination of epitaxial growth/implantation/counter doping/highly doped diffusing films can be used to dope the highly P-doped underlayer 114 to the desired level.

As also shown in FIG. 8, the first masking material 102 of FIG. 7 may be removed. As further shown in FIG. 8, a portion of the microelectronic substrate 110 where at least one NMOS nanowire transistor will be formed (see element 100$_{NMOS}$ of FIG. 2) may be masked with any appropriate second masking material 104, such as described with regard to the first masking material 102. The non-masked portion of the microelectronic substrate 110 where PMOS transistors will be formed (see element 100$_{PMOS}$ of FIG. 2) may have a highly N-doped underlayer 118 formed thereon in a similar manner described with regard to the highly P-doped underlayer 114. As shown in FIG. 9, the second masking material 104 of FIG. 8 may be removed.

It is understood that any damage incurred during the formation of the highly P-doped underlayer 114 and/or the highly N-doped underlayer 118 may be cured by annealing before further processing, such that subsequent material growth may not translate any defects from the highly P-doped underlayer 114 and/or the highly N-doped underlayer 118.

For the purposes for this application, the term "highly doped" may be defined to be at least the amount of dopant necessary to increase the threshold voltage at a bottom (e.g. an area closest to the microelectronic substrate 110) of the gate structure 150 (see FIG. 1), such that leakage is prevented during the operation of the nanowire transistor 100 (see FIG. 1). As will be understood to those skilled in the art, the amount of dopant necessary will depend on a variety of factors, including but not limited to, the type of dopant used (i.e. P-type or N-type), the dopant used, the materials used (e.g. gate material, microelectronic substrate material, etc.), the voltage of the nanowire transistor, and the like.

In one embodiment, as shown in FIG. 10, a first silicon material layer $142_1$ may be formed on the highly P-doped underlayer 114 and the highly N-doped underlayer 118, such as by epitaxial growth as known in the art, and a first silicon germanium material layer $144_1$ may be formed, such as by epitaxial growth, on the first silicon material layer $142_1$. This layering may be repeated to a desired number of alternating silicon material layers (shown as layers $142_1$, $142_2$, and $142_3$-collectively $142_n$) and silicon germanium material layers (shown as layers $144_1$, $114_2$, and $144_3$-collectively $144_n$) are formed to resulting a layered stack 146. In another embodiment, the layering order can be reversed with alternating layers of silicon material $144_n$ and silicon germanium material $142_n$ respectively formed on the microelectronic substrate 110.

In another embodiment, as the formation of the highly P-doped underlayer 114 and the highly N-doped underlayer 118 may result in gate induced drain leakage at an interface between source structures 120 and/or drain structures 130 of the NMOS nanowire transistors $100_{NMOS}$ and PMOS nanowire transistors $100_{PMOS}$ and their respective portion of the highly doped underlayer (i.e. highly P-doped underlayer 114 and highly N-doped underlayer 118), a thin layer of undoped or low doped material may be optionally formed on the highly P-doped underlayer 114 and the highly N-doped underlayer 118 to form a source/drain leakage barrier layer 122, as shown in FIG. 11. For the purposes of this application, the term "low doped material" may be defined to include a material layer having a dopant concentration lower than the highly P-doped underlayer 114 or the highly N-doped underlayer 118. In one embodiment, the source/drain leakage barrier layer 122 may be an undoped silicon-containing layer epitaxially grown on the P-doped underlayer 114 and the highly N-doped underlayer 118. In another embodiment, the source/drain leakage barrier layer 122 may be lightly doped with the dopant over which the portion of the source/drain leakage barrier layer 122 is formed. In other words, the source/drain leakage barrier layer 122 may be lightly doped with a P-type dopant in the portion over the highly P-doped underlayer 114 and/or may be lightly doped with an N-type dopant in the portion over the highly N-doped underlayer 118. In one embodiment, a thickness T of the source/drain leakage barrier layer 122 may be between about 0.5 and 5.0 nanometers.

After the formation of the source/drain leakage barrier layer 122, the layered stack 146, as previously discussed with regard to FIG. 10, may be formed thereon, as shown in FIG. 12.

Figure 13:
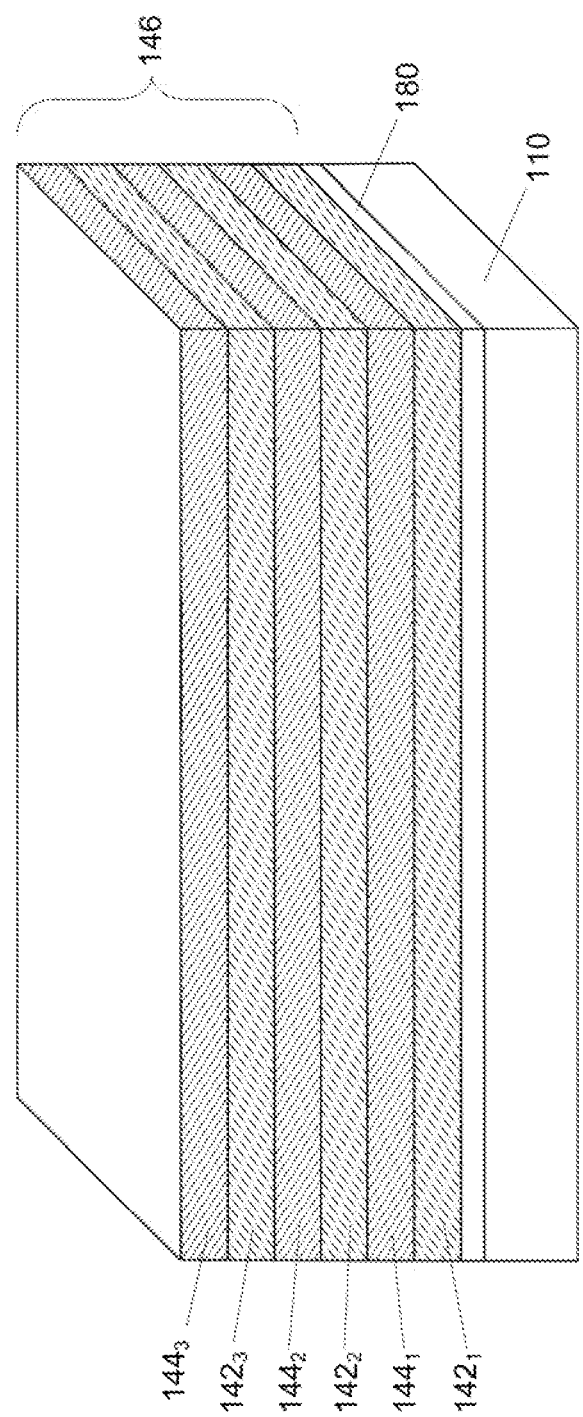
FIGS. 13-22 are oblique views of a process of forming a nanowire transistor, according to an embodiment of the present description.

FIGS. 13-22 illustrate a method of forming a nanowire transistor beginning with the layered stack 146 of FIGS. 10 and 12, as illustrated in FIG. 13. For the sake of conciseness and clarity, the formation of a single nanowire transistor will be illustrated, and, further, element 180 (hereinafter "underlayer 180") will represent either the highly P-doped underlayer 114/highly N-doped underlayer 118 with the optional source/drain leakage barrier layer 122, or the highly P-doped underlayer 114/highly N-doped underlayer 118 without the optional source/drain leakage barrier layer 122.

Figure 14:
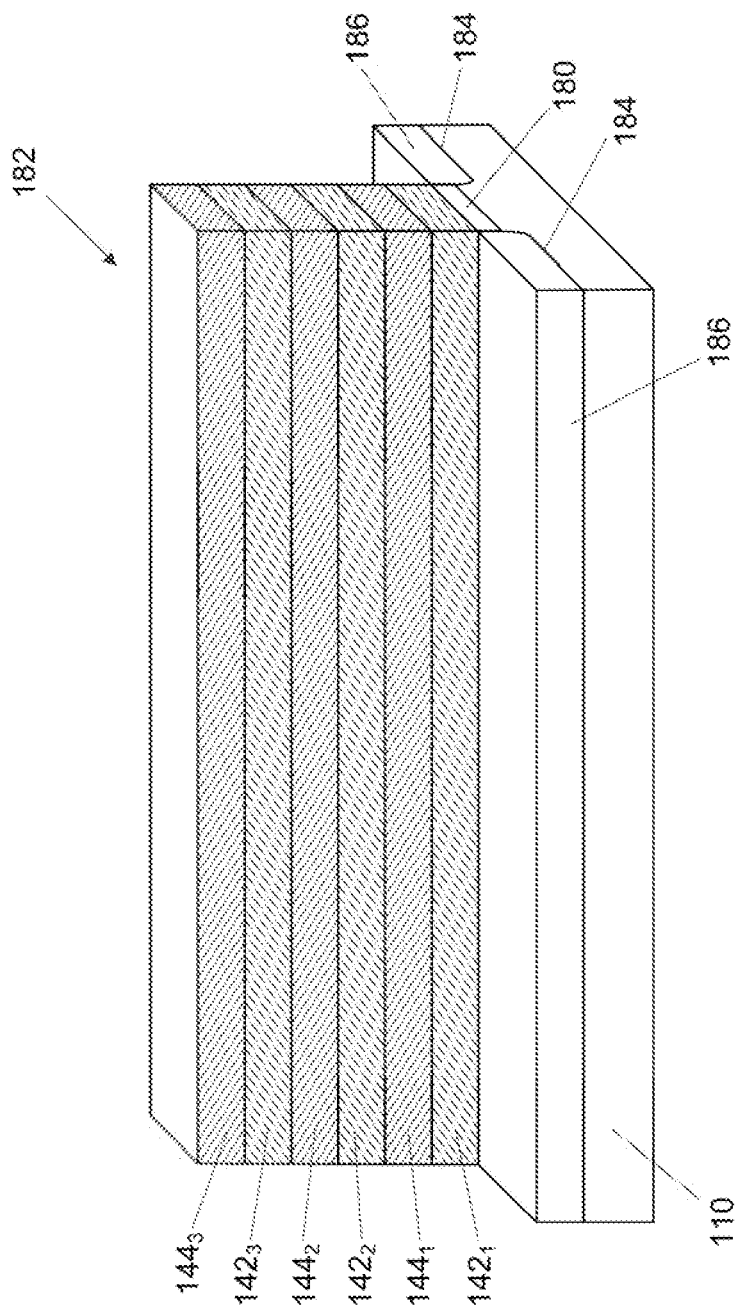

The layered stack 146 of silicon germanium/silicon/silicon germanium/silicon may be patterned using conventional patterning/etching techniques to form at least one fin structure 182. For example, the layered stack 146 (see FIG. 13) may be etched during a trench etch process, such as during a shallow trench isolation (STI) process, wherein trenches 184 may be formed through the underlayer 180 and into the microelectronic substrate 110 in the formation of the fin structure 182. As will be understood by those skilled in the art, a plurality of substantially parallel of fin structures 182 are generally formed simultaneously. A dielectric material 186, such as silicon dioxide, may be formed or deposited within the trenches 184 proximate the microelectronic substrate 110, as shown in FIG. 14, to electrically separate the fin structures 182.

Figure 15:
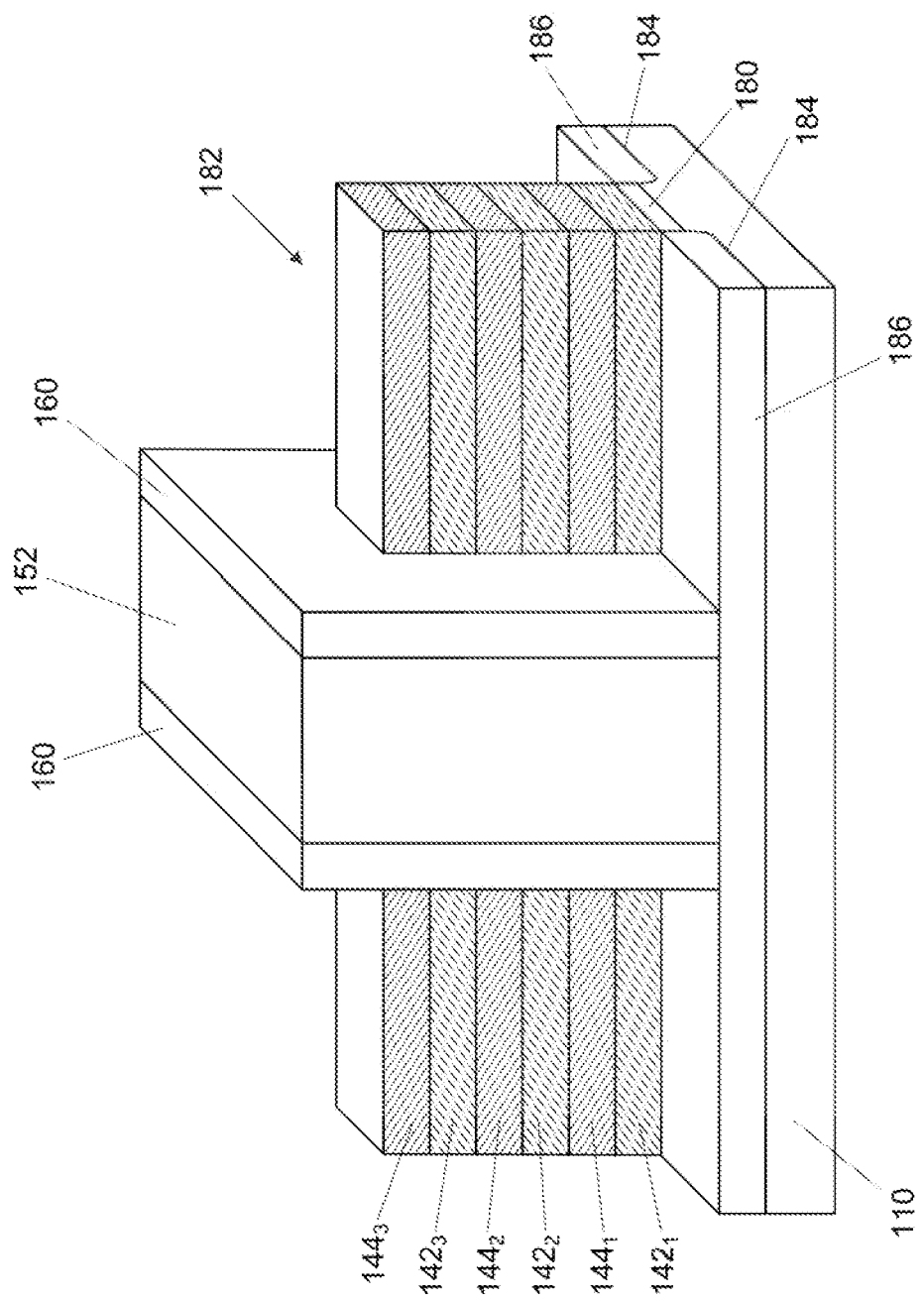
Figure 16:
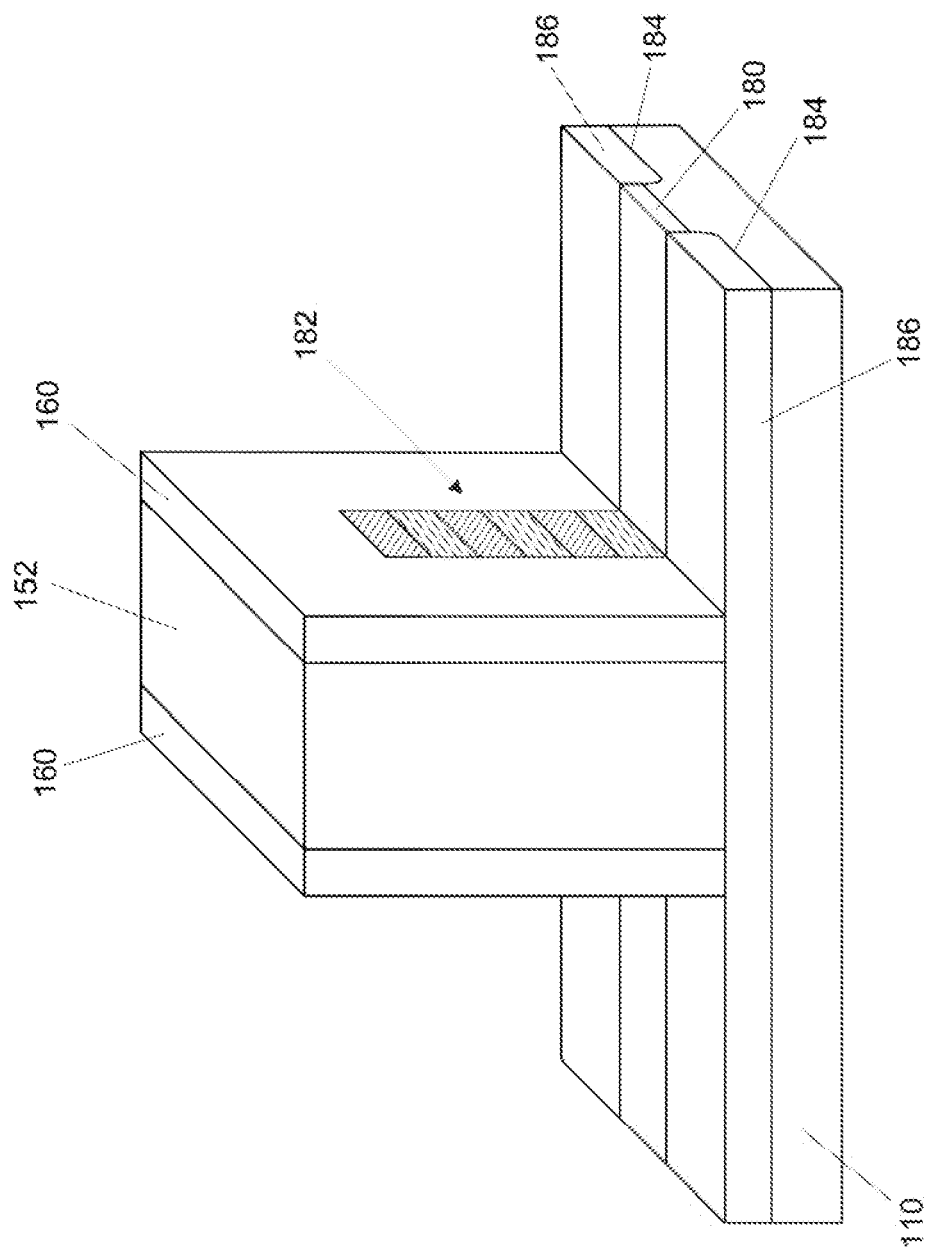

As shown in FIG. 15, spacers 160 may be formed on and across the fin structure 182 and may be disposed substantially orthogonally with respect to the fin structure 182. In an embodiment, the spacers 160 may comprise any material that may be selective during subsequent processing to the fin structure 182 materials, as will be discussed. As further shown in FIG. 15, a sacrificial gate electrode material 152 may be formed within/between spacers 160, and may be formed around portions of the fin structures 182 located between the spacers 160. In an embodiment, the sacrificial gate electrode material 152 may be formed around portions of the fin structure 182, and the spacers 160 may be formed on either side of the sacrificial gate electrode material 152. The sacrificial gate electrode material 152 may comprise polysilicon, as will be discussed. As shown in FIG. 16, a portion of each fin structure 182 (external to the gate electrode material 152 and the spacers 160) may be removed to expose the underlayer 180. The portions of each fin structure 182 may be removed by any process known in the art, including, but not limited to, a dry etching process.

Figure 17:
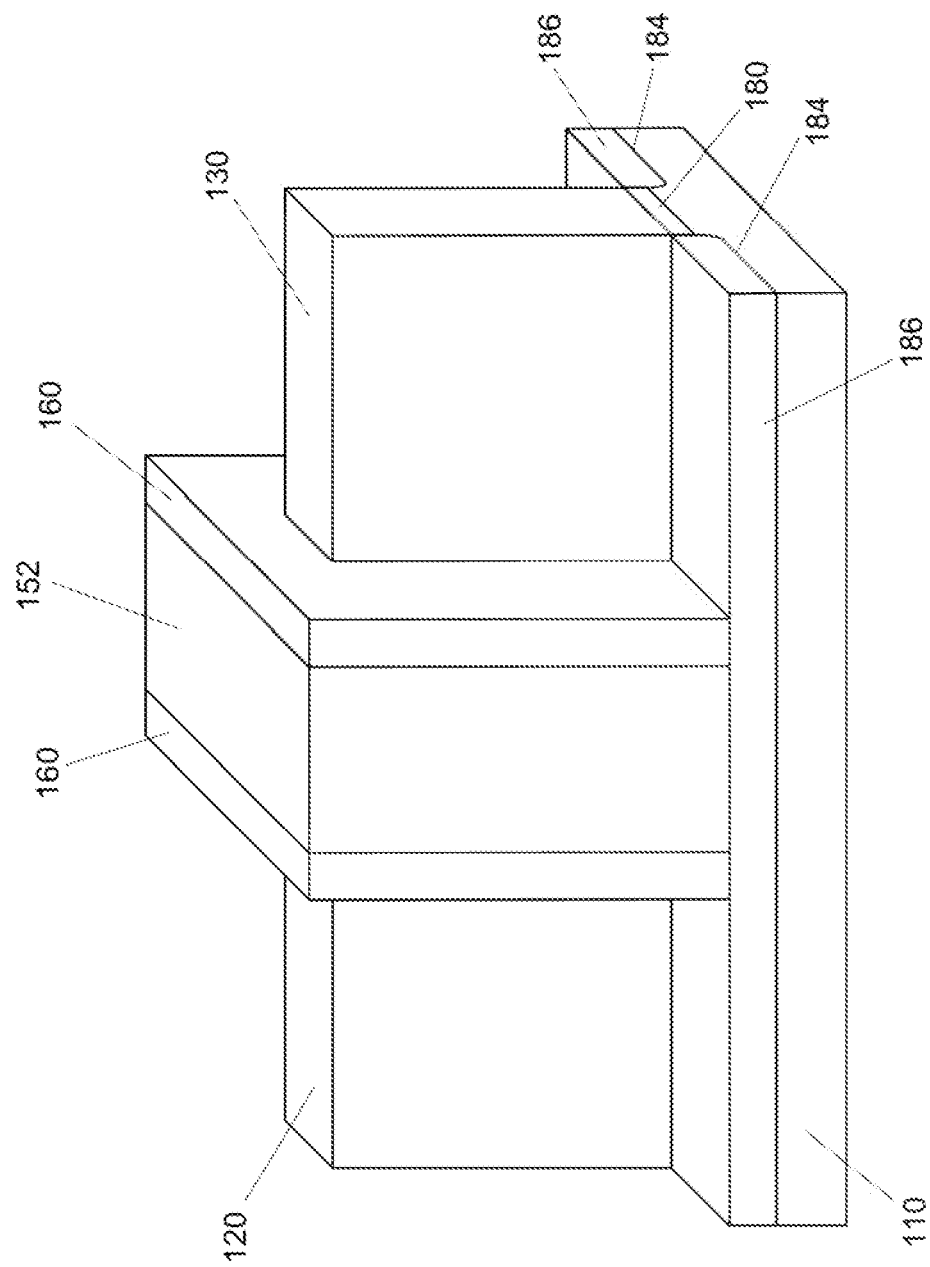

As shown in FIG. 17, a silicon or silicon germanium source structures 120 and a silicon or silicon germanium drain structures 130 may be formed, such as by an epitaxial growth technique, on the underlayer 180 on opposing sides of the fin structures 182, and may be coupled to the portions of the fin structures 182 disposed between the spacers 160. In an embodiment, the source structure 120 or the drain structures 130 may be n-doped silicon for an NMOS device, or may be p-doped silicon/silicon germanium for a PMOS device, depending on the device type for the particular application. Doping may be introduced in the epitaxial process, by implant, by plasma doping, by solid source doping or by other methods as are known in the art.

Figure 18:
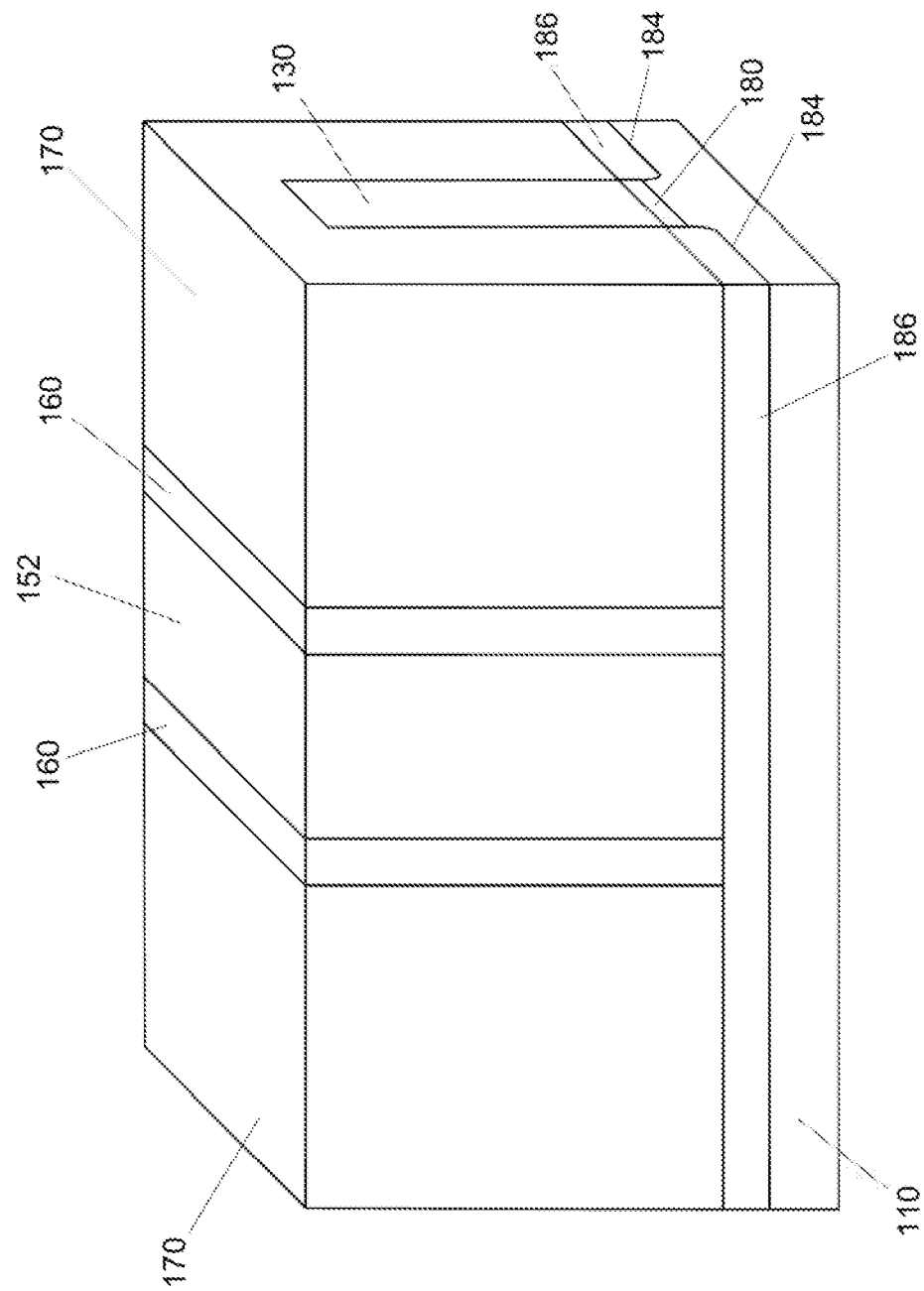
Figure 19:
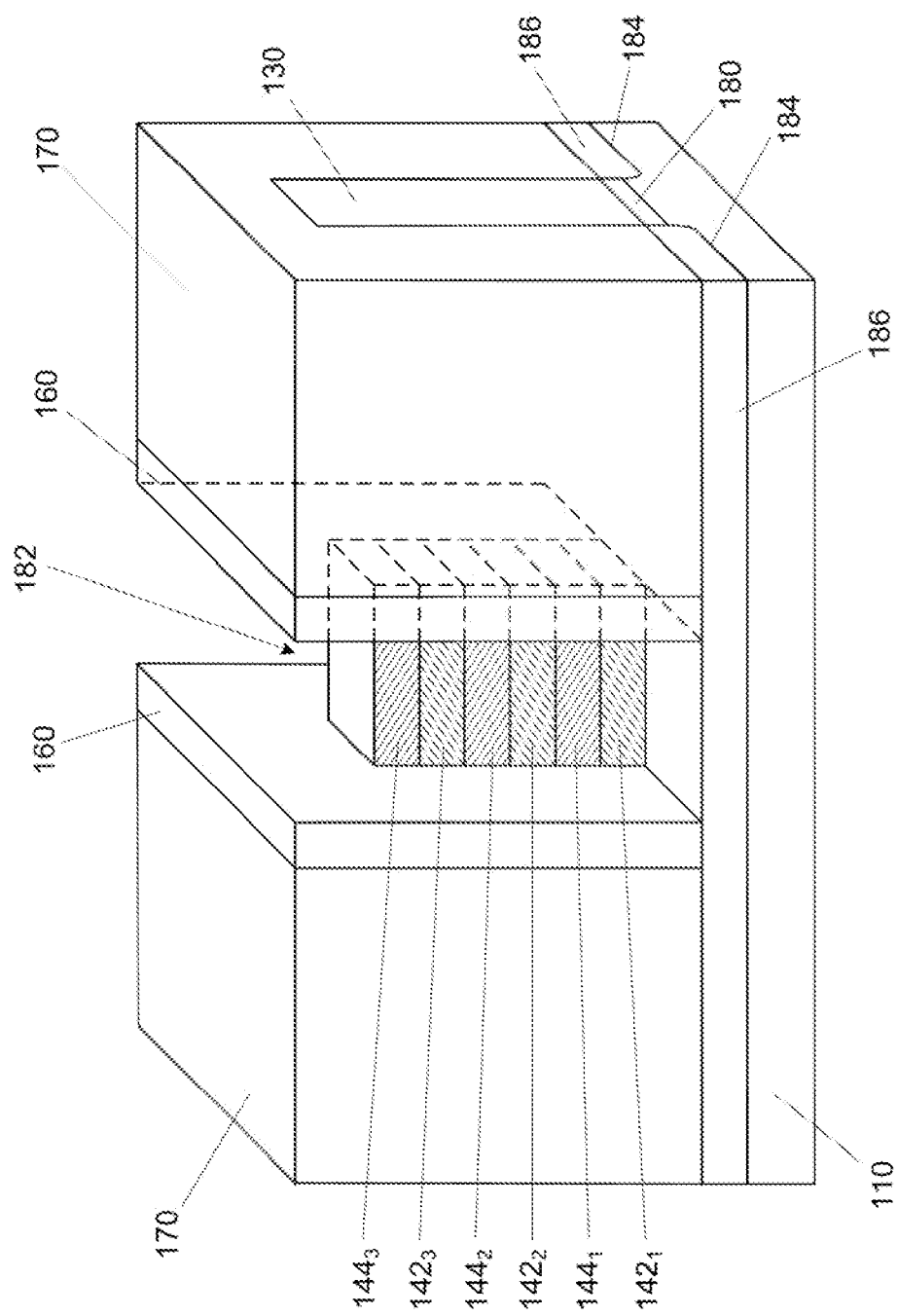
Figure 20:
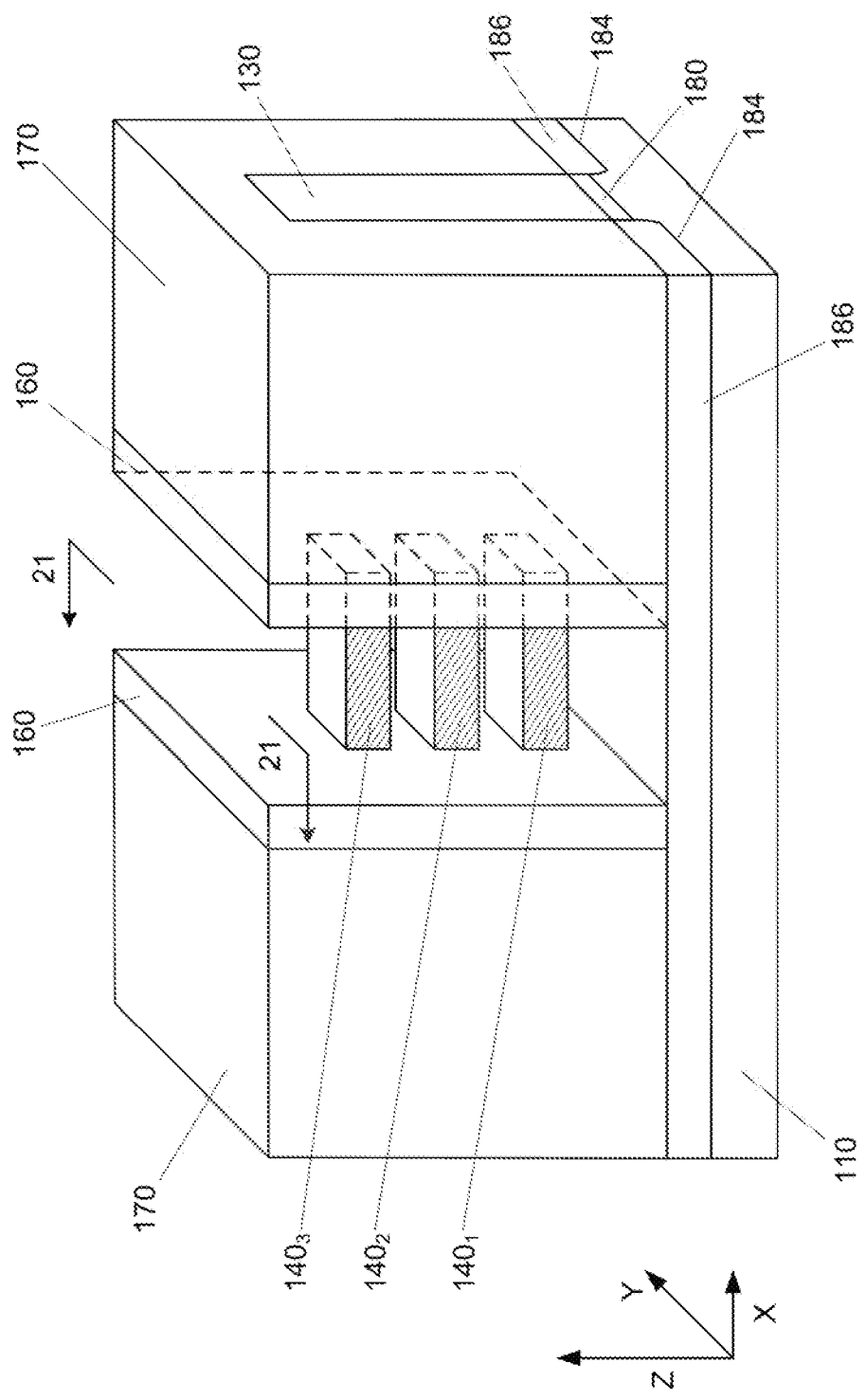

As shown in FIG. 18, the interlayer dielectric layer 170 may be formed on the microelectronic substrate 100 over the source structures 120, the drain structures 130, the sacrificial gate electrode material 152, and the spacers 160, wherein the interlayer dielectric layer 170 may be planarized, such as by chemical mechanical polishing, to expose the sacrificial gate material 152. As shown in FIG. 19, the sacrificial gate electrode material 152 may then be removed from between the spacer materials 160, such as by an etching process. As shown in FIG. 20, the silicon material layers $142_1$, $142_2$, and $142_3$ (see FIG. 19) may be selectively removed from the fin structure 182 (see FIG. 19) between the silicon germanium material layers $144_1$, $144_2$, and $144_3$ (see FIG. 19) to form silicon germanium channel nanowires/nanoribbons (illustrated as elements $140_1$, $140_2$, and $140_3$, and may be referred to herein collectively as "channel nanowires $140_n$") extending between the source structure 120 (see FIG. 17) and the drain structure 130, wherein the channel nanowires $140_n$ may be aligned vertically (e.g. z-direction) and spaced apart from one another. In an embodiment, the silicon material layers $142_1$, $142_2$, and $142_3$ may be etched with a wet etch that selectively removes the silicon material layers $142_1$, $142_2$, and $142_3$ while not etching the silicon germanium material layers $144_1$, $144_2$, and $144_3$. The wet etch may include, but is not limited to, aqueous hydroxide chemistries, including ammonium hydroxide and potassium hydroxide.

In another embodiment, the silicon germanium may be removed, rather than the silicon. The silicon germanium material layers $142_n$ may be selectively removed from the fin structure between the silicon material layers $144_n$. Thus, the resulting channel nanowires $140_n$, as illustrated in FIG. 20, may be formed from silicon. In an embodiment, the silicon germanium may be etched selectively with a wet etch that selectively removes the silicon germanium while not etching the silicon with a wet etch including, but is not limited to solution of carboxylic acid/nitric acid/hydrofluoric acid, and solutions of citric acid/nitric acid/hydrofluoric acid. In some embodiments of the invention, the same silicon/silicon germanium stack is used to form both transistors with silicon channel nanowires and transistors with silicon germanium channel nanowires. In another embodiment of the invention, the layering order of the silicon/silicon germanium stack may alternate depending on whether silicon channel nanowires or silicon germanium channel nanowires are being formed.

In an embodiment, both silicon and silicon germanium channel nanowires $140_n$ may exist on the same wafer, in the same die, or on the same circuit, for example as NMOS Si and PMOS SiGe in an inverter structure. In an embodiment with NMOS Si and PMOS SiGe in the same circuit, the Si channel thickness (SiGe interlayer) and SiGe channel thickness (Si interlayer) may be mutually chosen to enhance circuit performance and/or circuit minimum operating voltage. In an embodiment, the number of nanowires on different devices in the same circuit may be changed through an etch process to enhance circuit performance and/or circuit minimum operating voltage.

Figure 21:
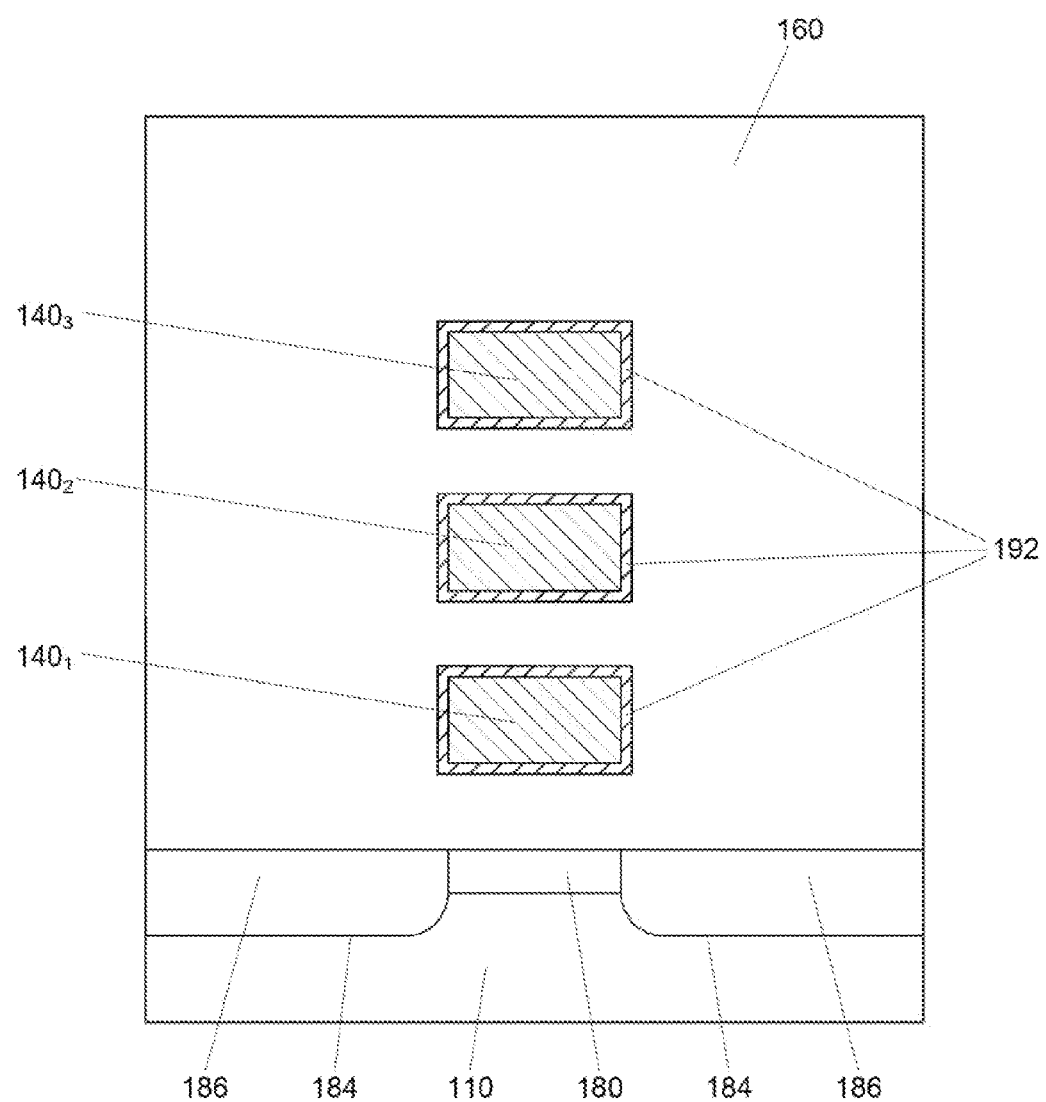

As shown in FIG. 21 (cross-section along line 21-21 of FIG. 20), a gate dielectric material 192 may be formed to surround the channel nanowires $140_1$, $140_2$, and $140_3$ between the spacers 160. In an embodiment, the gate dielectric material 192 may comprise a high k gate electrode material, wherein the dielectric constant may comprise a value greater than about 4. In another embodiment, the gate dielectric material 192 may be formed conformally around the nanowire structures $140_1$, $140_2$, and $140_3$.

Figure 22:
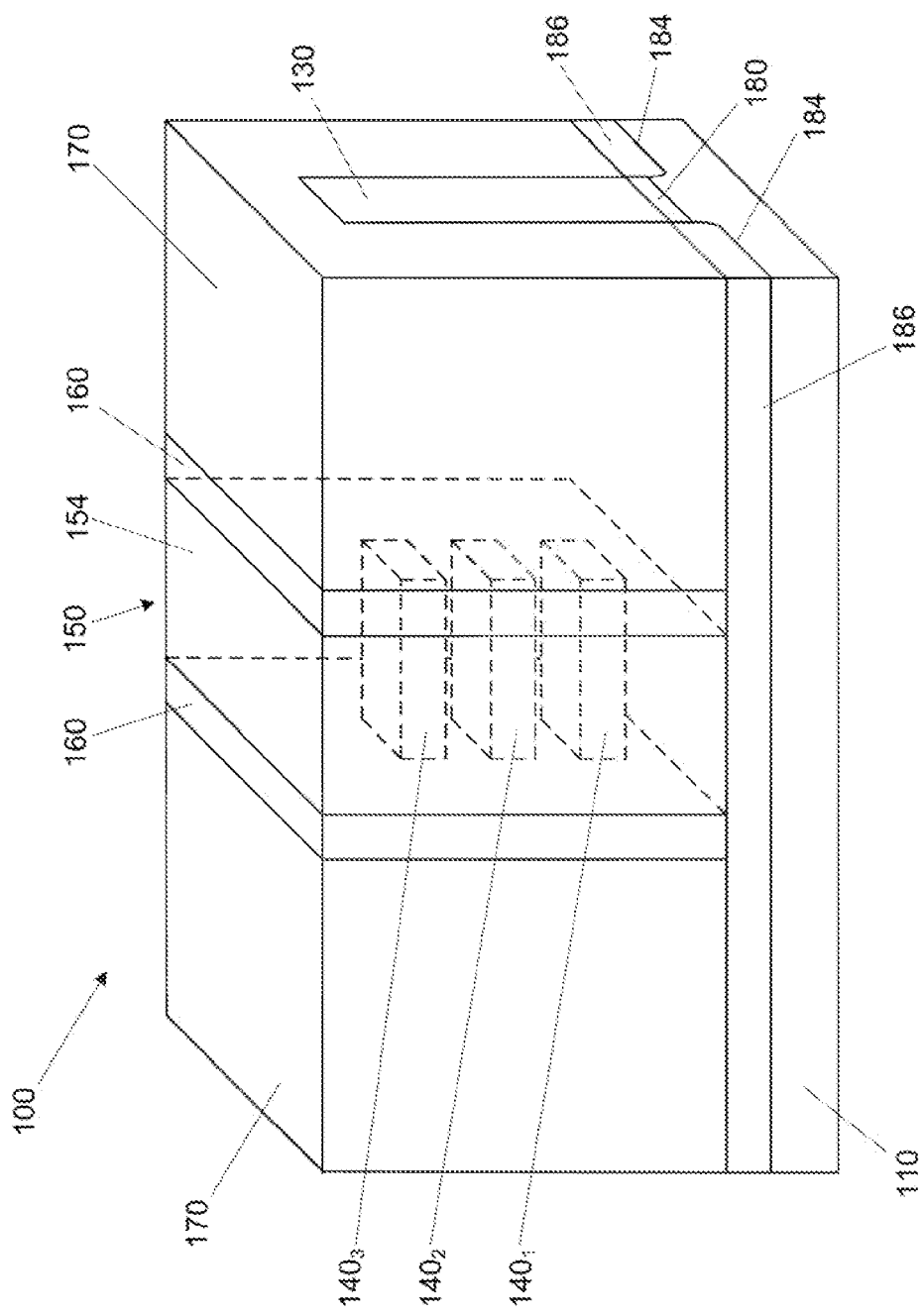

As shown in FIG. 22, a gate electrode material 154 may then be formed around the nanowire structures $140_1$, $140_2$, and $140_3$ to form the gate electrode 150 and thereby forming a nanowire transistor 100. The gate electrode material may comprise any appropriate conductive material, including, but not limited to, pure metal and alloys of titanium, tungsten, tantalum, aluminum, including nitrides such as tantalum nitride and titanium nitride, and also including alloys with rare earths, such as erbium and dysprosium, or noble metals such as platinum. It is understood that the processing, not shown, may be conducted, such as forming trench contacts to the source structure 120 and the drain structure 130. In an embodiment, standard CMOS processing may be further performed on the microelectronic substrate 110 to fabricate a CMOS device according to embodiments herein. It will be understood to those skilled in the art, the highly P-doped underlayer 114 and the highly N-doped underlayer 118 (see FIG. 22) should be positioned at least between its respective gate electrode 150 and the microelectronic substrate 110. As will be further understood to those skilled in the art, the source/drain leakage barrier layer 122, if used, should be position between the microelectronic substrate 110 and its respective source structure 120 and/or drain structure 130.

As will be understood to those skilled in the art, the highly P-doped underlayer 114 and/or the highly N-doped underlayer 118 could be formed by traditional retrograde junction implant after the silicon material layers $102_n$ and the silicon germanium material layers $104_n$ are formed. However, such a method would leave significant amount of dopant in the silicon material layers $102_n$ and silicon germanium material layers $104_n$, thus fully undoped nanowire channels could not be formed. The presence of dopant in the nanowire channels could degrade carrier mobility and could increase random dopant fluctuation, as will be understood to those skilled in the art.

Figure 23:
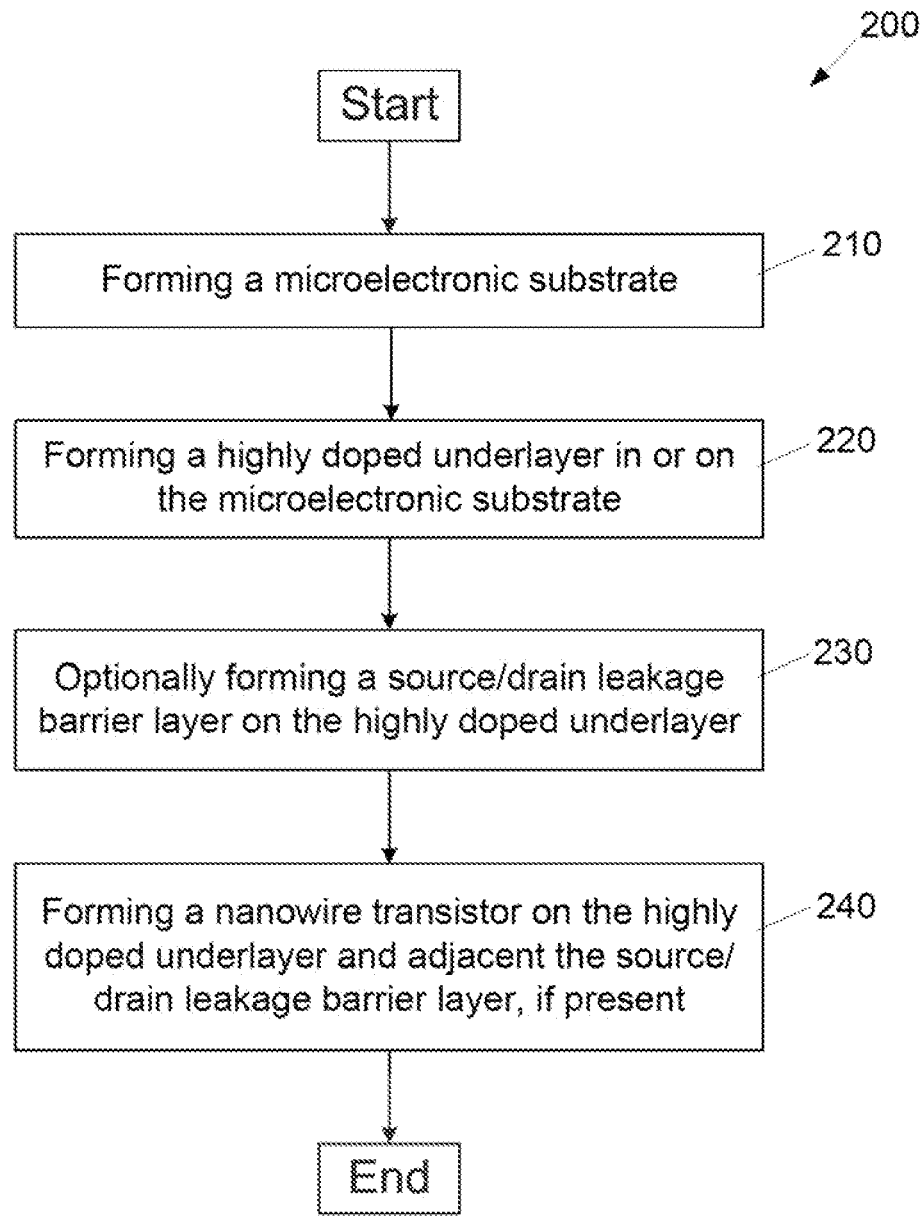
FIG. 23 is a flow chart of a process of fabricating a microelectronic device, according to an embodiment of the present description.

FIG. 23 is a flow chart of a process 200 of fabricating a nanowire transistor structure according to an embodiment of the present description. As set forth in block 210, a microelectronic substrate may be formed. A highly doped underlayer may be formed in or on the microelectronic substrate, as set forth in block 220. As set forth in block 230, an optional source/drain leakage barrier layer may be formed on the highly doped underlayer. A nanowire transistor may be formed on the highly doped underlayer and adjacent the source/drain leakage barrier layer, if present, as set forth in block 240.

Figure 24:
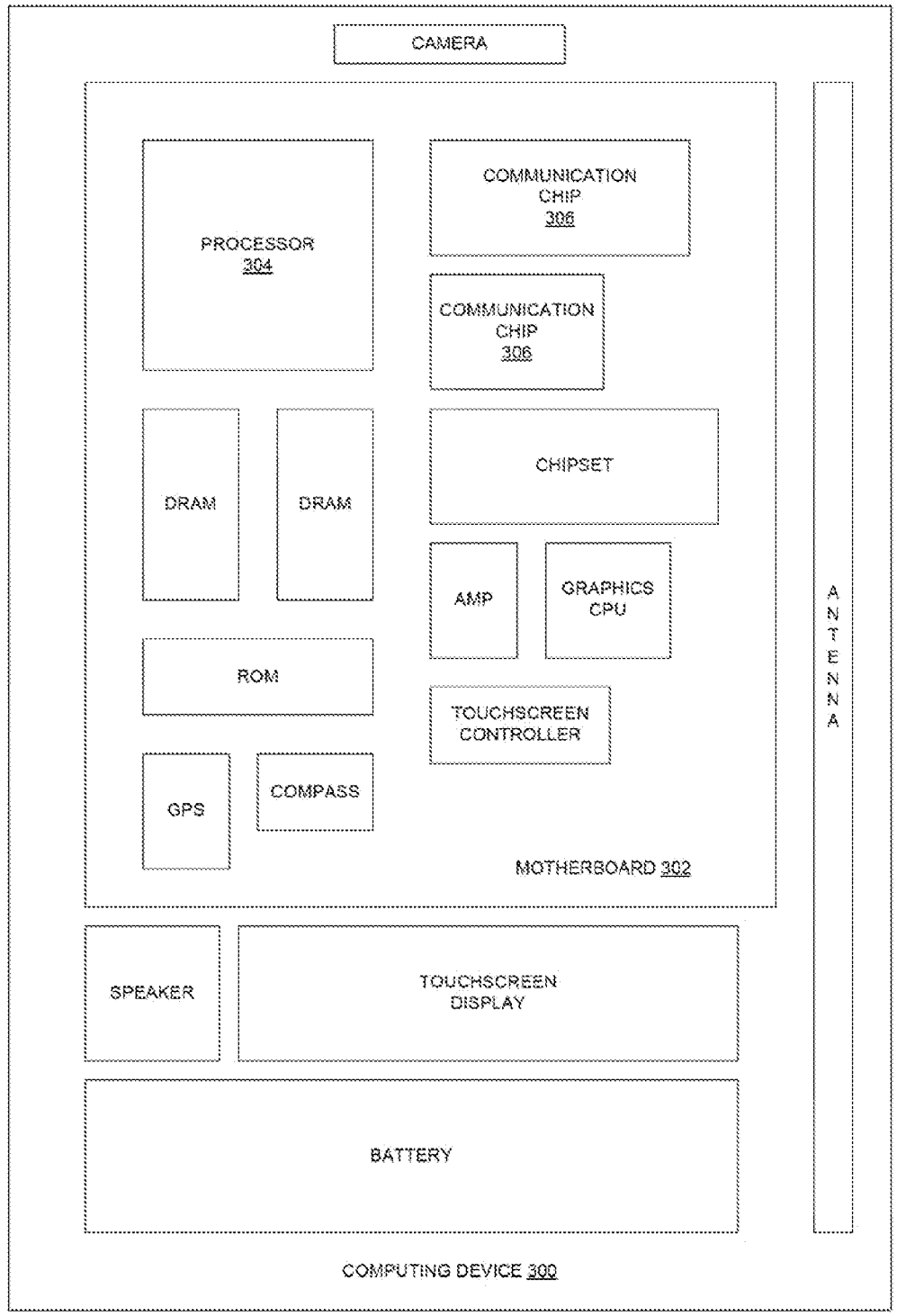
FIG. 24 illustrates a computing device in accordance with one implementation of the present description.

FIG. 24 illustrates a computing device 300 in accordance with one implementation of the present description. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor includes one or more devices, such as nanowire transistors built in accordance with implementations of the present description. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the present description, the integrated circuit die of the communication chip includes one or more devices, such as nanowire transistors built in accordance with implementations of the present description.

In further implementations, another component housed within the computing device 300 may contain an integrated circuit die that includes one or more devices, such as nanowire transistors built in accordance with implementations of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-24. The subject matter may be applied to other microelectronic device and assembly applications, as well as any appropriate transistor application, as will be understood to those skilled in the art.

The following examples pertain to further embodiments, wherein Example 1 is a microelectronic structure, comprising a microelectronic substrate; at least one nanowire transistor formed on the microelectronic substrate; and a highly doped underlayer formed between the microelectronic substrate and the at least one nanowire transistor.

In Example 2, the subject matter of Example 1 can optionally include the highly doped underlayer comprising a dopant layer implanting in the microelectronic substrate.

In Example 3, the subject matter of Example 1 can optionally include the highly doped underlayer comprising a highly doped material layer formed on the microelectronic substrate.

In Example 4, the subject matter of Example 3 can optionally include the highly doped material layer comprising a highly doped epitaxial silicon layer.

In Example 5, the subject matter of any of Examples 1 to 4 can optionally include the highly doped underlayer comprising a highly P-doped underlayer and wherein the at least one nanowire transistor comprises at least one NMOS nanowire transistor.

In Example 6, the subject matter of any of Examples 1 to 4 can optionally include the highly doped underlayer comprising a highly N-doped underlayer and wherein the at least one nanowire transistor comprises at least one PMOS nanowire transistor.

In Example 7, the subject matter of any of Examples 1 to 4 can optionally include a portion of the highly doped underlayer comprising a highly P-doped underlayer portion with the at least one nanowire transistor comprising at least one NMOS nanowire transistor formed thereon, and a portion of the highly doped underlayer comprising a highly N-doped underlayer portion with the at least one nanowire transistor comprising at least one PMOS nanowire transistor formed thereon.

In Example 8, the subject matter of any of one of Examples 1 to 7 can optionally include a source/drain leakage barrier layer between the highly doped underlayer and the nanowire transistor.

In Example 9, the subject matter of Example 8 can optionally include the source/drain leakage barrier layer having a thickness between about 0.5 and 5.0 nanometers.

In Example 10, the subject matter of either Example 8 or 9 can optionally include the source/drain leakage barrier layer barrier layer comprising an undoped material layer.

In Example 11, the subject matter of Example 10 can optionally include the undoped material layer comprising an epitaxial silicon layer.

In Example 12, the subject matter of Example 8 or 9, wherein the source/drain leakage barrier layer comprises a low doped material layer.

In Example 13, a method of forming a microelectronic structure, comprising forming a microelectronic substrate; forming at least one nanowire transistor on the microelectronic substrate; and forming a highly doped underlayer formed between the microelectronic substrate and the at least one nanowire transistor.

In Example 14, the subject matter of Example 13 can optionally include forming the highly doped underlayer comprising implanting a dopant into the microelectronic substrate.

In Example 15, the subject matter of Example 13 can optionally include forming the highly doped underlayer comprising forming a highly doped material layer on the microelectronic substrate.

In Example 16, the subject matter of Example 15 can optionally include forming the highly doped underlayer comprising forming a highly doped epitaxial silicon layer.

In Example 17, the subject matter of any of Examples 13 to 16 can optionally include forming the highly doped underlayer comprising forming a highly P-doped underlayer and wherein forming the at least one nanowire transistor comprises forming at least one NMOS nanowire transistor.

In Example 18, the subject matter of any of Examples 13 to 16 can optionally include forming the highly doped underlayer comprises forming a highly N-doped underlayer and wherein forming the at least one nanowire transistor comprises forming at least one PMOS nanowire transistor.

In Example 19, the subject matter of any of Examples 13 to 16 can optionally include forming the highly doped underlayer comprises forming a portion of the highly doped underlayer as a highly P-doped underlayer with the at least one nanowire transistor comprising at least one NMOS nanowire transistor formed thereon, and forming a portion of the highly doped underlayer as a highly N-doped underlayer portion with the at least one nanowire transistor comprising at least one PMOS nanowire transistor formed thereon.

In Example 20, the subject matter of any of Example 13 to 16 can optionally include forming the highly doped underlayer comprising forming a first mask over a portion of the microelectronic substrate; ion implanting one of a P-type or an N-type dopant into an unmasked portion of the microelectronic substrate; removing the first mask; forming a second mask over the ion implanted portion of the microelectronic substrate, ion implanting the other of the P-type or the N-type dopant into an unmasked portion of the microelectronic substrate; and removing the second mask.

In Example 21, the subject matter of any of Examples 13 to 16 can optionally include forming the highly doped underlayer comprising forming a first mask over a portion of the microelectronic substrate; forming a material layer having one of a P-type or an N-type dopant therein on an unmasked portion of the microelectronic substrate; removing the first mask; forming a second mask over the ion implanted portion of the microelectronic substrate; forming a material layer having the other of the P-type or the N-type dopant therein on an unmasked portion of the microelectronic substrate; and removing the second mask.

In Example 22, the subject matter of any of Examples 13 to 21 can optionally further include forming a source/drain leakage barrier layer between the highly doped underlayer and the nanowire transistor.

In Example 23, the subject matter of Example 22 can optionally include forming the source/drain leakage barrier layer comprising forming the source/drain leakage barrier layer having a thickness between about 0.5 and 5.0 nanometers.

In Example 24, the subject matter of any of Examples 22 to 23 can optionally include forming the source/drain leakage barrier layer barrier layer comprising forming an undoped material layer.

In Example 25, the subject matter of Example 24 can optionally include forming the undoped material layer comprising forming an epitaxial silicon layer.

In Example 26, the subject matter of any of Examples 22 to 23 can optionally include the undoped material layer comprising a low doped material layer.

In Example 27, a computing device may include a board including at least one component; wherein the at least one component includes at least one microelectronic structure comprising a microelectronic substrate; at least one nanowire transistor formed on the microelectronic substrate; and a highly doped underlayer formed between the microelectronic substrate and the at least one nanowire transistor.

In Example 28, the subject matter of Example 27 can optionally further include a source/drain leakage barrier layer between the highly doped underlayer and the nanowire transistor.

In Example 29, the subject matter of Example 28 can optionally include the source/drain leakage barrier layer barrier layer comprising an undoped material layer.

In Example 30, the subject matter of Example 28 can optionally include the source/drain leakage barrier layer comprising a low doped material layer.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic structure, comprising:
a microelectronic substrate;
at least one nanowire transistor formed on the microelectronic substrate, wherein the at least one nanowire transistor comprises:
a source structure extending from the microelectronic substrate;
a drain structures extending from the microelectronic substrate; and
at least one nanowire channel extending between the source structure and the drain structure, wherein the at least one nanowire channel is disposed over a microelectronic substrate;
a highly doped underlayer abutting the microelectronic substrate;
a source/drain leakage barrier layer abutting the highly doped underlayer and positioned between the highly doped underlayer and the at least one nanowire channel, wherein the source/drain leakage barrier layer comprises an undoped material layer; and
a gate electrode material surrounding the at least one nanowire channel, wherein a portion of the gate electrode material extends between the at least one nanowire channel and the source/drain leakage barrier layer.

2. The microelectronic structure of claim 1, wherein the highly doped underlayer comprises a dopant layer implanted in the microelectronic substrate.

3. The microelectronic structure of claim 1, wherein the highly doped underlayer comprises a highly doped material layer formed on the microelectronic substrate.

4. The microelectronic structure of claim 3, wherein the highly doped material layer comprises a highly doped epitaxial silicon layer.

5. The microelectronic structure of claim 1, wherein the highly doped underlayer comprises a highly P-doped underlayer and wherein the at least one nanowire transistor comprises at least one NMOS nanowire transistor.

6. The microelectronic structure of claim 1, wherein the highly doped underlayer comprises a highly N-doped underlayer and wherein the at least one nanowire transistor comprises at least one PMOS nanowire transistor.

7. The microelectronic structure of claim 1, wherein a portion of the highly doped underlayer comprises a highly P-doped underlayer portion with the at least one nanowire transistor comprising at least one NMOS nanowire transistor formed thereon, and wherein a portion of the highly doped underlayer comprises a highly N-doped underlayer portion with the at least one nanowire transistor comprising at least one PMOS nanowire transistor formed thereon.

8. The microelectronic structure of claim 1, wherein the source/drain leakage barrier layer has a thickness between about 0.5 and 5.0 nanometers.

9. The microelectronic structure of claim 1, wherein the undoped material layer comprises an epitaxial silicon layer.

10. A method of forming a microelectronic structure, comprising:
forming a microelectronic substrate;
forming at least one nanowire transistor on the microelectronic substrate, comprising:
forming a source structure extending from the microelectronic substrate;
forming a drain structures extending from the microelectronic substrate; and
forming at least one nanowire channel extending between the source structure and the drain structure, wherein the at least one nanowire channel is disposed over a microelectronic substrate;
forming a highly doped underlayer abutting the microelectronic substrate;
forming a source/drain leakage barrier layer abutting the highly doped underlayer and positioned between the highly doped underlayer and the at least one nanowire channel, wherein forming the source/drain leakage barrier layer comprises forming an undoped material layer; and forming a gate electrode material surrounding the at least one nanowire channel, wherein a portion of the gate electrode material extends between the at least one nanowire channel and the source/drain leakage barrier layer.

11. The method of claim 10, wherein forming the highly doped underlayer comprises implanting a dopant into the microelectronic substrate.

12. The method of claim 10, wherein forming the highly doped underlayer comprises forming a highly doped material layer on the microelectronic substrate.

13. The method of claim 12, wherein forming the highly doped material layer comprises forming a highly doped epitaxial silicon layer.

14. The method of claim 10, wherein forming the highly doped underlayer comprises forming a highly P-doped underlayer and wherein forming the at least one nanowire transistor comprises forming at least one NMOS nanowire transistor.

15. The method of claim 10, wherein forming the highly doped underlayer comprises forming a highly N-doped underlayer and wherein forming the at least one nanowire transistor comprises forming at least one PMOS nanowire transistor.

16. The method of claim 10, wherein forming the highly doped underlayer comprises forming a portion of the highly doped underlayer as a highly P-doped underlayer with the at least one nanowire transistor comprising at least one NMOS nanowire transistor formed thereon, and forming a portion of the highly doped underlayer as a highly N-doped underlayer portion with the at least one nanowire transistor comprising at least one PMOS nanowire transistor formed thereon.

17. The method of claim 10, wherein forming the highly doped underlayer comprises:
   forming a first mask over a portion of the microelectronic substrate;
   ion implanting one of a P-type or an N-type dopant into an unmasked portion of the microelectronic substrate;
   removing the first mask;
   forming a second mask over the ion implanted portion of the microelectronic substrate;
   ion implanting the other of the P-type or the N-type dopant into an unmasked portion of the microelectronic substrate; and
   removing the second mask.

18. The method of claim 10, wherein forming the highly doped underlayer comprises:
   forming a first mask over a portion of the microelectronic substrate;
   forming a material layer having one of a P-type or an N-type dopant therein on an unmasked portion of the microelectronic substrate;
   removing the first mask;
   forming a second mask over the ion implanted portion of the microelectronic substrate;
   forming a material layer having the other of the P-type or the N-type dopant therein on an unmasked portion of the microelectronic substrate; and
   removing the second mask.

19. The method of claim 10, wherein forming the source/drain leakage barrier layer comprising forming the source/drain leakage barrier layer having a thickness between about 0.5 and 5.0 nanometers.

20. The method of claim 10, wherein forming the undoped material layer comprises forming an epitaxial silicon layer.

21. A computing device, comprising:
   a board including at least one component;
   wherein the at least one component includes at least one microelectronic structure comprising:
      a microelectronic substrate;
      at least one nanowire transistor formed on the microelectronic substrate, wherein the at least one nanowire transistor comprises:
         a source structure extending from the microelectronic substrate;
         a drain structures extending from the microelectronic substrate; and
         at least one nanowire channel extending between the source structure and the drain structure, wherein the at least one nanowire channel is disposed over a microelectronic substrate;
      a highly doped underlayer abutting the microelectronic substrate;
      a source/drain leakage barrier layer abutting the highly doped underlayer and positioned between the highly doped underlayer and the at least one nanowire channel, wherein the source/drain leakage barrier layer comprises an undoped material layer; and
      a gate electrode material surrounding the at least one nanowire channel, wherein a portion of the gate electrode material extends between the at least one nanowire channel and the source/drain leakage barrier layer.

* * * * *